US010516439B2

(12) United States Patent
Kostinsky et al.

(10) Patent No.: US 10,516,439 B2
(45) Date of Patent: Dec. 24, 2019

(54) INTERFERENCE TESTING

(71) Applicant: Intel Corporation, Santa Clara, CA (US)

(72) Inventors: Alexey Kostinsky, Nahariya (IL); Tomer Levy, Tel Aviv (IL); Paul S. Cheses, Tel Aviv (IL); Danny Naiger, Even Hehuda (IL); Theodore Z. Schoenborn, Portland, OR (US); Christopher P. Mozak, Beaverton, OR (US); Nagi Aboulenein, King City, OR (US); James M. Shehadi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/666,436

(22) Filed: Aug. 1, 2017

(65) Prior Publication Data

US 2017/0359099 A1    Dec. 14, 2017

Related U.S. Application Data

(62) Division of application No. 14/229,460, filed on Mar. 28, 2014, now Pat. No. 9,722,663.

(51) Int. Cl.
*H04B 3/487* (2015.01)
*G06F 11/00* (2006.01)
(Continued)

(52) U.S. Cl.
CPC ............. *H04B 3/487* (2015.01); *G06F 11/00* (2013.01); *G01R 31/28* (2013.01);
(Continued)

(58) Field of Classification Search
CPC ........... H04B 3/487; H04B 3/46; G06F 11/00; G06F 7/58; G01R 31/28; G01R 31/31855; G01R 31/318385; H04L 1/244
See application file for complete search history.

(56) References Cited

U.S. PATENT DOCUMENTS 6,381,269 B1    4/2002  Gradi et al.
7,272,756 B2 *  9/2007  Brink .................. H04L 1/244
                                        375/221
(Continued)

FOREIGN PATENT DOCUMENTS

JP    2011253253 A    12/2011
TW    200844463  A    11/2008
TW    201405562  A     2/2014

OTHER PUBLICATIONS

Dragonwins; "Linear Feedback Shift Registers"; (Nov. 27, 2010); 18 pages.

*Primary Examiner* — Sophia Vlahos
(74) *Attorney, Agent, or Firm* — Thorpe North & Western, LLP

(57) ABSTRACT

In one example a controller comprises logic, at least partially including hardware logic, configured to implement a first iteration of an interference test on a communication interconnect comprising a victim lane and a first aggressor lane by generating a first set of pseudo-random patterns on the victim lane and the aggressor lane using a first seed and implement a second iteration of an interference test by advancing the seed on the first aggressor lane. Other examples may be described.

9 Claims, 12 Drawing Sheets

(51) Int. Cl.
　　　*G01R 31/3185*　　(2006.01)
　　　*G01R 31/28*　　　(2006.01)
　　　*G01R 31/3183*　　(2006.01)
　　　*G06F 7/58*　　　 (2006.01)

(52) U.S. Cl.
　　　CPC ................. *G01R 31/31855* (2013.01); *G01R 31/318385* (2013.01); *G06F 7/58* (2013.01)

(56) References Cited

U.S. PATENT DOCUMENTS

| | | |
|---|---|---|
| 7,539,489 B1 | 5/2009 | Alexander |
| 2005/0097153 A1 | 5/2005 | Dirscherl et al. |
| 2005/0166110 A1 | 7/2005 | Swanson et al. |
| 2007/0005269 A1 | 1/2007 | Mitchell |
| 2008/0178055 A1 | 7/2008 | Nakamura |
| 2009/0192777 A1 | 7/2009 | Clement et al. |
| 2009/0220083 A1 | 9/2009 | Schneider |
| 2009/0262362 A1 | 10/2009 | Groot et al. |
| 2010/0188097 A1* | 7/2010 | Sul .................. G01R 31/31717 324/537 |
| 2010/0251040 A1* | 9/2010 | Zerbe ............. G01R 31/31703 714/715 |
| 2011/0131458 A1 | 6/2011 | Mazak et al. |
| 2015/0212917 A1* | 7/2015 | Morrison ............ G06F 11/3062 713/340 |

\* cited by examiner

FIG. 1    Electronic Device 100

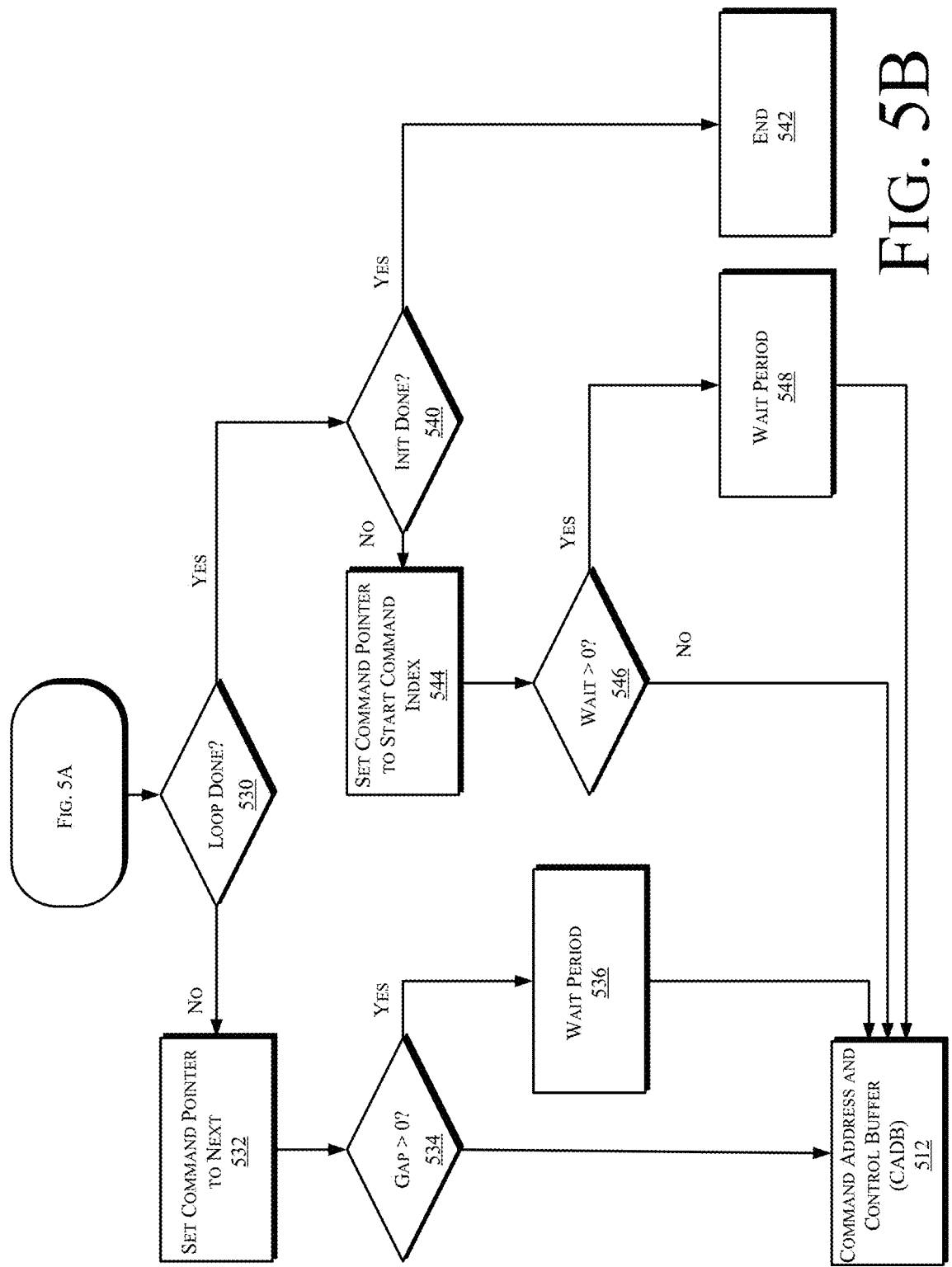

INTERFERENCE TESTING

CROSS-REFERENCE TO RELATED APPLICATIONS

This application is a divisional application of U.S. patent application Ser. No. 14/229,460, filed on Mar. 28, 2014, issuing as U.S. Pat. No. 9,722,663, which is incorporated herein by reference in its entirety.

BACKGROUND

The subject matter described herein relates generally to the field of electronic devices and more particularly to interference testing in electronic devices.

Electronic devices include components communicatively coupled by interconnects such as Peripheral Component Interconnect Express (PCIe), Universal Serial Bus (USB), Double Data Rate (DDR), or the like. These communication interfaces are subject to noise, such as inter-symbol interference and crosstalk, which may be caused by design flaws or manufacturing flaws such as imperfect interconnects, board routing, vias, or the like. Designers and manufacturers of such electronic devices need to determine the impact of inter-symbol interference in electronic devices. Thus, techniques for interference testing may find utility, e.g., in electronic devices.

BRIEF DESCRIPTION OF THE DRAWINGS

The detailed description is described with reference to the accompanying figures.

FIG. 5B is a flowchart illustrating operations in a method to implement interference testing in accordance with some examples.

DETAILED DESCRIPTION

Described herein are exemplary systems and methods to implement interference testing in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to perform interference testing in communication interconnects in electronic devices such as computer systems, tablet computing devices, mobile phones, electronic readers, and the like. The subject matter described herein addresses these and other issues by providing interference testing techniques which may be used to test for interference in communication interconnects for use in electronic devices. In some examples the techniques described herein may be implemented as logic (e.g., software, firmware, or logic circuitry) which may be incorporated into an electronic device. For example, the logic may be implemented as an interference manager module which may be accessed during configuration of an electronic device, such as via the basic input/output system (BIOS).

A first interference testing technique described herein enables the creation of patterns which enhance the ability to test for signal-to-signal crosstalk between adjacent lanes on a communication interconnect. A second interference testing technique enables the creation of patterns which enhance the ability to test for inter-symbol interference (ISI) on each lane on a communication interconnect. A third interference testing technique described herein enables the testing process to implement a programmable number of repetitions and to incorporate gaps and waits into the testing process. The techniques described herein may be implemented independently or may be combined.

Figure 1:
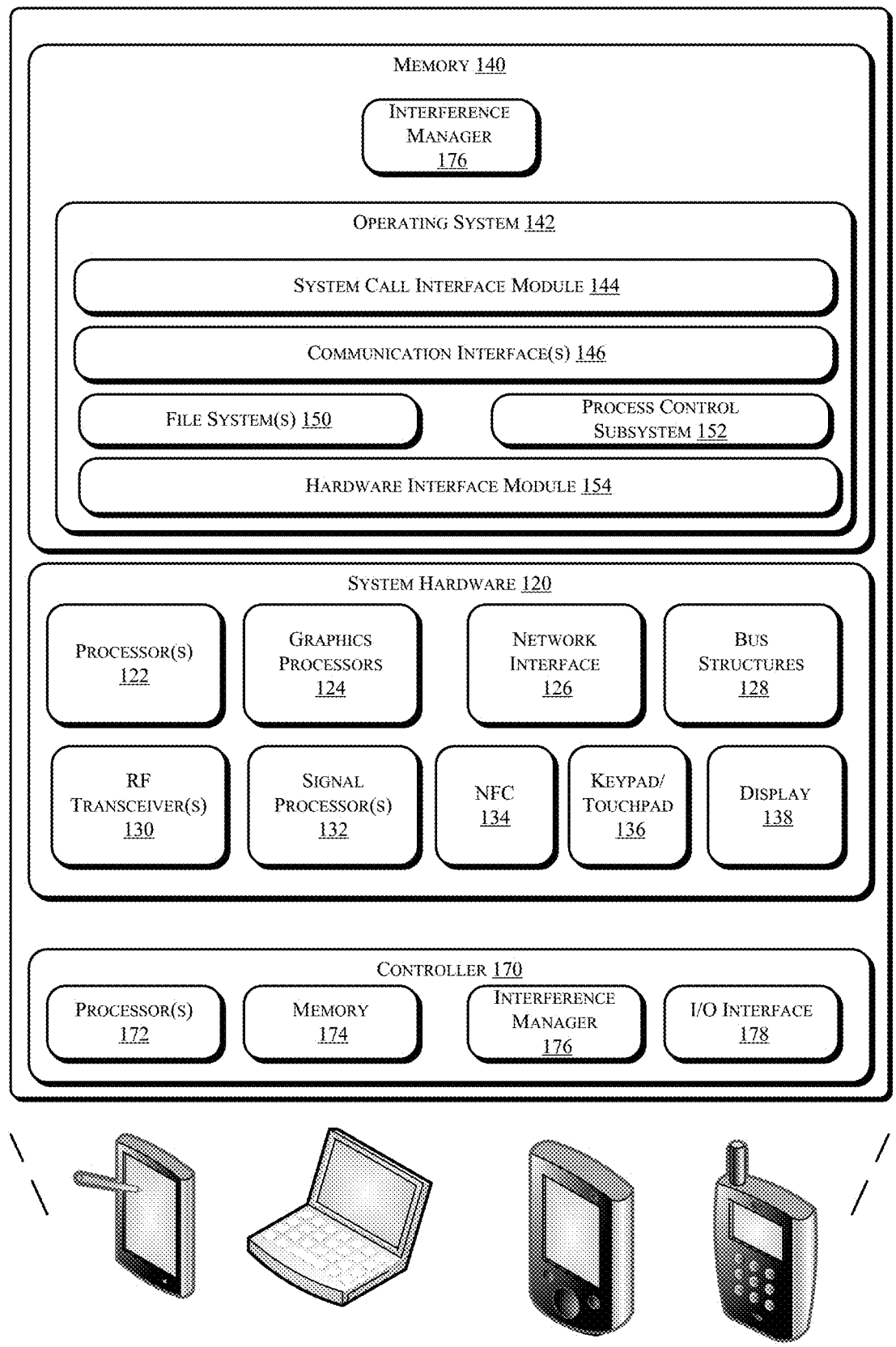
FIG. 1 is a schematic illustration of an electronic device which may include communication interfaces which may be subject to interference testing in accordance with some examples.

FIG. 1 is a schematic illustration of an electronic device 100 which may be adapted to implement interference testing in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., a solid state drive (SSD), one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN-Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN-Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more input/output interfaces such as, e.g., a keypad 136 and a display 138. In some examples electronic device 100 may not have a keypad and use the touch panel for input.

Memory 140 may include an operating system 142 for managing operations of electronic device 100. In one embodiment, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms or as logic instructions which may be executed on a processor in the user space or kernel of the operating system.

In the embodiment depicted in FIG. 1 the controller 170 comprises a processor 172, a memory module 174, an interference manager 176, and an I/O interface 178. In some examples the memory module 174 may comprise a persistent flash memory module and the various functional modules may be implemented as logic instructions encoded in the persistent memory module, e.g., firmware or software. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122. In some examples the interference manager 176 may reside in the memory 140 of electronic device 100 and may be executable on one or more of the processors 122.

Figure 2:
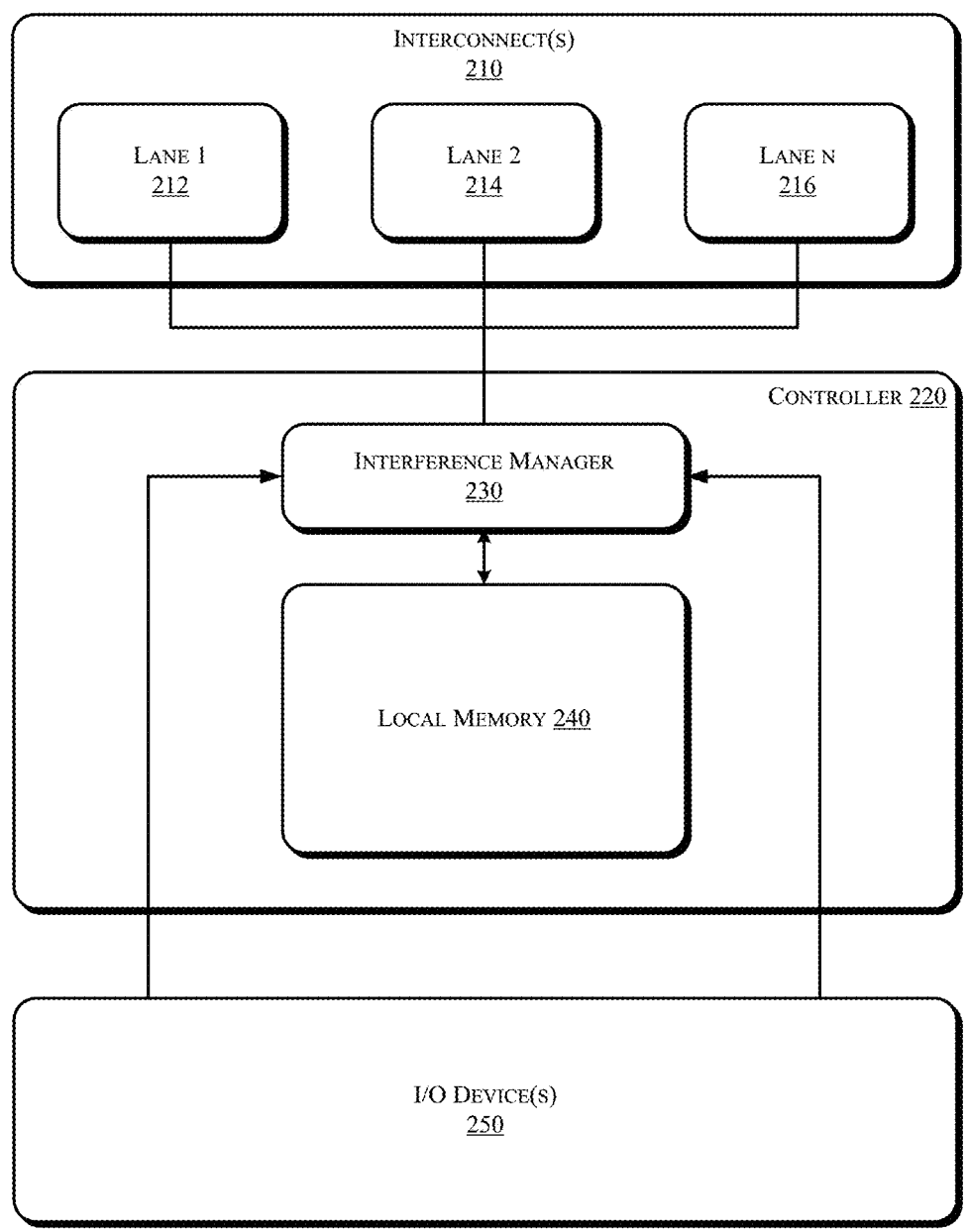
FIG. 2 is a high-level schematic illustration of an exemplary architecture to implement interference testing in accordance with some examples.

In some examples the interference manager 176 interacts with one or more other components of the electronic device 100 to implement interference testing for one or more communication interconnects in electronic devices. FIG. 2 is a high-level schematic illustration of an exemplary architecture to implement interference testing in accordance with some examples. Referring to FIG. 2, a controller 220 may be embodied as general purpose processor 122 or as a low-power controller such as controllers 170. Controller 220 may comprise an interference manager 230 to manage interference testing operations and a local memory 240. As described above, in some examples the interference manager 230 may be implemented as logic instructions executable on controller 220, e.g., as software or firmware, or may be reduced to hardwired logic circuits. Local memory 240 may be implemented using volatile and/or non-volatile memory.

Controller 220 may be communicatively coupled to one or more input/output device(s) 250. For example, the controller 220 may be communicatively coupled to one or more of the I/O devices described above.

Interference manager 230 may be communicatively coupled to one or more interconnects 210 which enable communication between components of electronic device 100. For example, the interconnect 210 may be one or more of a Peripheral Component Interconnect Express (PCIe), Universal Serial Bus (USB), Double Data Rate (DDR) interconnect and may comprise multiple communication lanes 214, 214, 216.

Figure 3A:
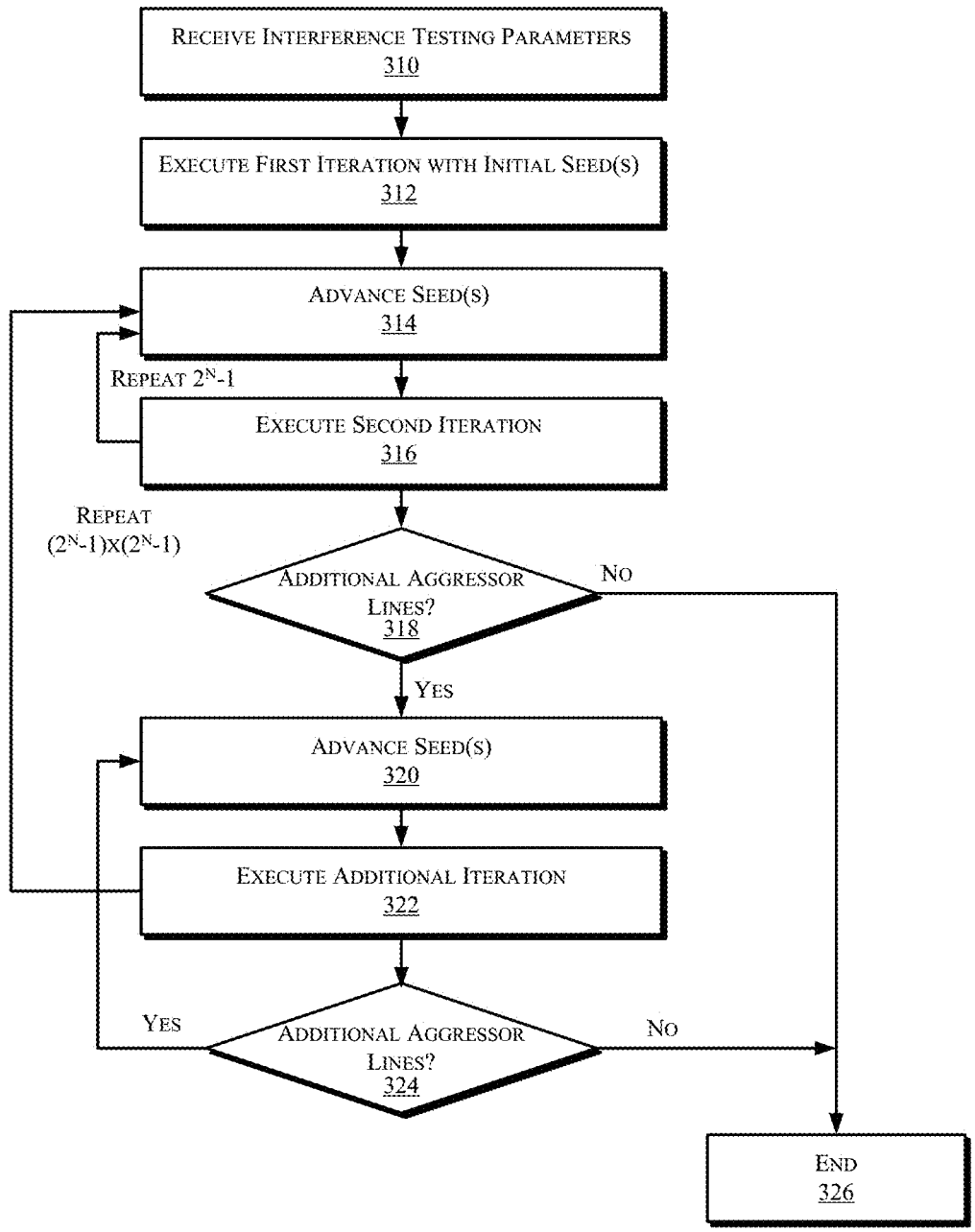
FIG. 3A is a flowchart illustrating operations in a method to implement interference testing in accordance with some examples.
Figure 3B:
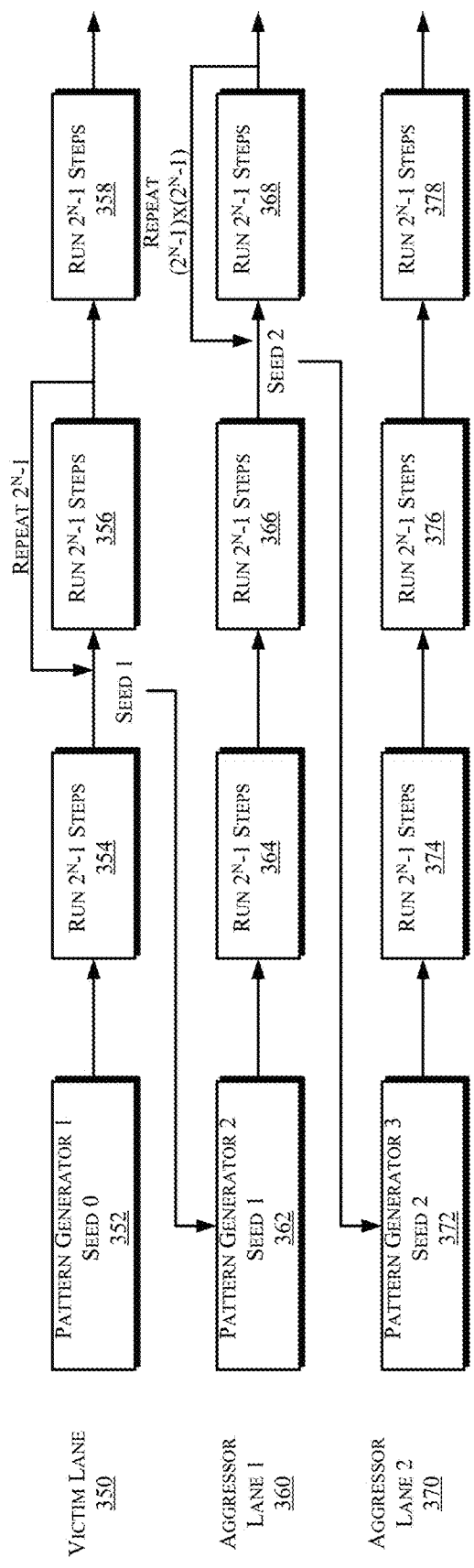
FIG. 3B illustrates iterations in an interference testing process, in accordance with some examples.
Figure 3C:
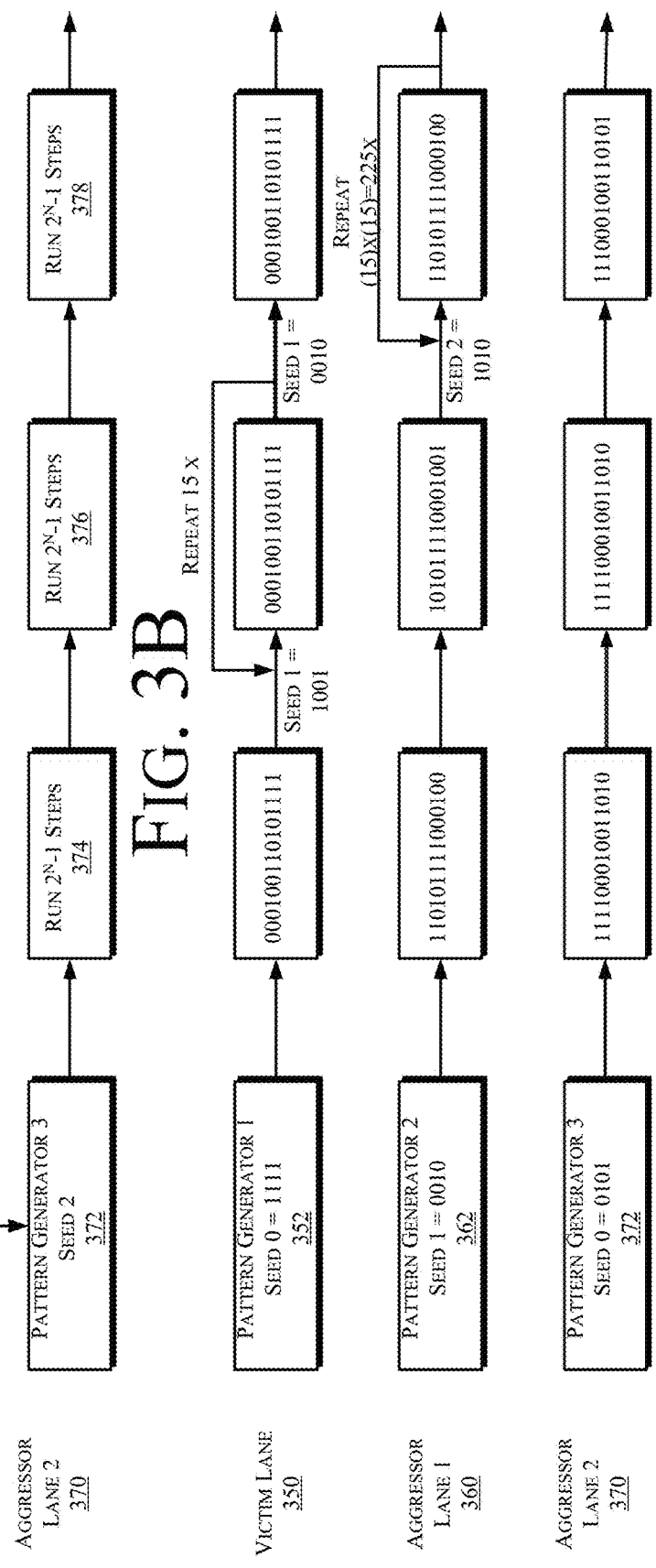
FIG. 3C illustrates iterations in an interference testing process, in accordance with some examples.

Having described various structures of a system to implement interference testing in electronic devices, operating aspects of a system will be now be explained. A first example of interference testing techniques implements an iterative testing procedure in which seeds for pseudo-random number generators are varied in a predetermined manner to increase the number of testing permutations applied to adjacent signal lanes. This first example of interference testing will be explained with reference to FIGS. 3A-3C. FIG. 3A is a flowchart illustrating operations in a first method to implement interference testing in an electronic device. The operations depicted in the flowchart of FIG. 3A may be implemented by the interference manager 230, alone or in combination with other components of electronic device 100. FIGS. 3B-3C illustrate iterations in an interference testing process, in accordance with some examples.

Referring first to FIG. 3A, at operation 310 the interference manager 230 receives one or more interference testing parameters. For example, interference testing parameters may be input to interference manager 230 by a user in charge of managing interference testing for the electronic device 100. Alternatively, or in addition, interference testing parameters may be retrieved from a memory location on the electronic device 100.

At operation 312 the interference manager 230 executes a first iteration of interference testing with an initial set of seeds. In some examples the interference testing process may test for interference between one or more aggressor lanes and a victim lane in a communication interconnect. Referring briefly to FIG. 3B, in one example the interference testing process tests for interference between a first aggressor lane 360, a victim lane 350, and a second aggressor lane 370. Each lane on the communication interconnect is communicatively coupled to a pattern generator 352, 362, 372 which generates a pseudo-random pattern that is transmitted on the lane of the communication interconnect. Transmission characteristics of the victim lane 350 may then be measured to determine signal-to-signal crosstalk measurements for the interconnect. By way of example, the pattern generators 352, 362, 372 may be implemented as linear feedback shift registers (LFSRs).

In some examples the first iteration is implemented with the respective pattern generators 352, 362, 372 are provided with respective first seeds. FIG. 3C illustrates a specific example of an interference test. In the example depicted in FIG. 3C pattern generator 1 is provided with a seed of 1111, while pattern generator 2 is provided with a seed of 0010 and pattern generator 3 is provided with a seed of 0101.

In the first iteration of interference testing the interference manager 230 runs a number of cycles equal to $2^N-1$, where N corresponds to the seed length. In the specific example illustrated in FIG. 3 the seed length is four (4), so the runs 15 test cycles (354, 364, 374), testing each pattern from the pattern generators for interference on the victim lane 360.

When the first iteration finishes, control passes to operation 314 and the interference manager 230 advances the seeds on one or more of the lanes. By way of example, referring to FIG. 3B on the initial wrap (i.e., completion) of the first $2^N-1$ cycles, seed 1 is advanced and another cycle of $2^N-1$ cycles (356, 366, 376) is executed (operation 316) $2^N-1$ times, each time advancing seed 1.

If, at operation 318, there are no more aggressor lines on the interconnect then control passes to operation 326 and the interference test may be terminated. By contrast, if at operation 318 there are additional aggressor lines on the interconnect then control passes to operation 320 and the interference manager 230 again advances the seeds on one or more of the lanes. By way of example, referring to FIG. 3B on the wrap (i.e., completion) of the second $2^N-1$ cycles seed 2 is advanced and another cycle of $2^N-1$ cycles times $2^N-1$ as described above (358, 368, 378) is executed (operation 322) $2^N-1$ times, resulting in a total of $(2^N-1) \times (2^N-1) \times (2^N-1)$ cycles for the full execution of the system with 1 victim and 2 aggressor pattern generators.

If, at operation 324, there are no more aggressor lines on the interconnect then control passes to operation 326 and the interference test may be terminated. By contrast, if at operation 324 there are additional aggressor lines on the interconnect then control passes back to operation 320 and the interference manager 230 again advances the seeds on one or more of the lanes. Thus, operations 320-324 define a loop by which the interference manager 230 may continue to advance the seeds of aggressor lanes in order to test different combinations of patterns on the interconnect, each time repeating all the previous steps $2^N-1$ times.

Figure 4A:
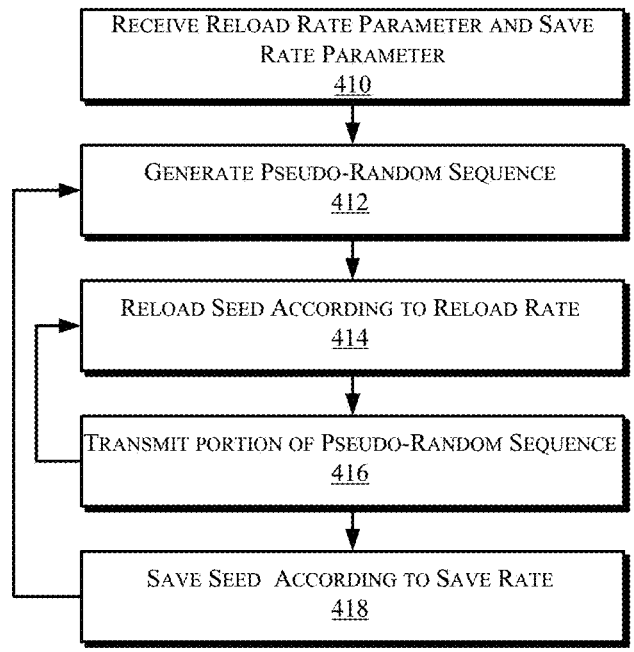
FIG. 4A is a flowchart illustrating operations in a method to implement interference testing in accordance with some examples.
Figure 4B:
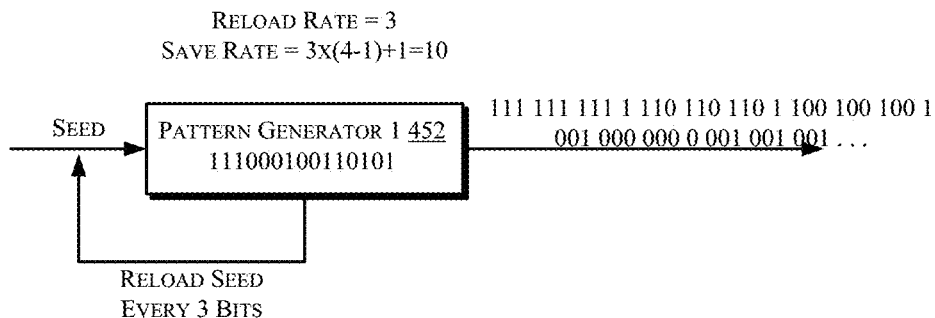
FIG. 4B illustrates iterations in an interference testing process, in accordance with some examples.
Figure 4C:
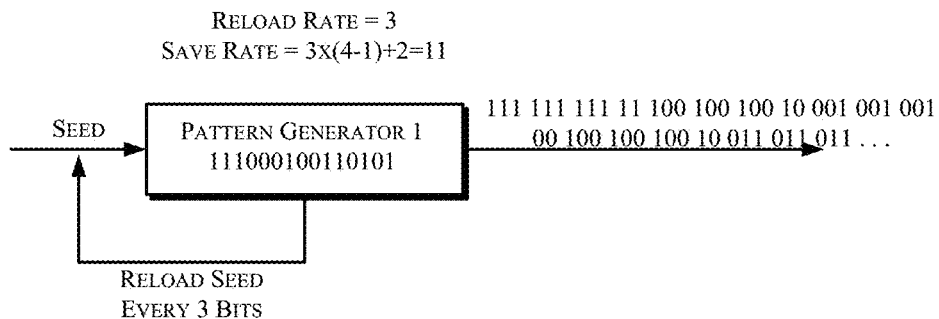
FIG. 4C illustrates iterations in an interference testing process, in accordance with some examples.

A second example of interference testing techniques implements an iterative testing procedure in which seeds for pseudo-random number generators are reloaded at a predetermined rate in order to repeat portions of the pseudo-random codes transmitted on the communication interconnect to test for inter-symbol interference. This second example of interference testing will be explained with reference to FIGS. 4A-4C. FIG. 4A is a flowchart illustrating operations in a second method to implement interference testing in an electronic device. The operations depicted in the flowchart of FIG. 4A may be implemented by the interference manager 230, alone or in combination with other components of electronic device 100. FIGS. 4B-4C illustrate iterations in an interference testing process, in accordance with some examples.

Referring first to FIG. 4A, at operation 410 the interference manager 230 receives a reload rate parameter and a save rate parameter. For example, a reload rate parameter and a save rate parameter may be input to interference manager 230 by a user in charge of managing interference testing for the electronic device 100. Alternatively, or in addition, interference testing parameters may be retrieved from a memory location on the electronic device 100.

At operation 412 the interference manager 230 generates a pseudo-random sequence. By way of example, referring to FIG. 4B, the interference manager 230 may provide a seed to a pattern generator 452 to generate a pseudo-random pattern. As described above, the pattern generator 452 may be implemented as linear feedback shift registers (LFSR). In response to the seed the pattern generator 452 generates an n-bit pseudorandom number (e.g., 111000100110101 for a 15-bit LFSR).

At operation 414 the seed is reloaded into the pattern generator 452 in accordance with the reload rate, and at operation 416 a portion of the pseudo-random sequence is transmitted on the interconnect. At operation 418 the seed is saved in accordance with the save rate.

FIG. 4B illustrates an example in which the reload rate is configured to repeat every 3 bits of the pseudo-random code 4 times, and the save rate is 10 (3×(4−1)+1). In accordance with the operations depicted in FIG. 4A, a seed is input to the pattern generator 452 and is reloaded every 3 bits, and repeated 4 times. This results in the pattern generator 452 outputting a pattern which repeats the first 3 bits of the pseudo-random pattern generated by pattern generator 452 four times. The repeating pattern advances by 10 mod 3=1 bit in each iteration, resulting in (3−1=2) bits overlap between the repeating patterns contents. Such pattern can be used, for instance for evaluating resonative effects on the interconnect, with the Reload rate correlating with the effective electrical length of the potential resonative structure.

FIG. 4C illustrates an example in which the reload rate is configured to repeat every 3 bits of the pseudo-random code 4 times, and the save rate is 11 (3×(4−1)+2). In accordance with the operations depicted in FIG. 4A, a seed is input to the pattern generator 452 and is reloaded every 3 bits, and repeated 4 times. This results in the pattern generator 452 outputting a pattern which repeats the first 3 bits of the pseudo-random pattern generated by pattern generator 452 four times. The repeating pattern advances by 10 mod 3=2 bits in each iteration, resulting in (3−2=1) bit overlap between the repeated patterns contents.

A third example of interference testing techniques implements logic which provides means to toggle patterns on command, control, and address lanes with programmable length, gaps, loops and wait time between them for Joint Electron Device Engineering Council (JEDEC) Double Data Rate (DDR) family of buses (e.g. DDR3, DDR4) or low power DDR buses (e.g., LPDDR2, LPDDR3, LPDDR4 etc.). In the third example the logic starts at idle and transition to read from the command address data buffer (CADB), which is a buffer identifying a value for each command, control and address lines. The logic continues to read from the CADB starting from a start buffer pointer to end buffer pointer which defines a loop. A counter may be used to indicate how many loops to do, and how many have been executed. When the buffer pointer reaches the end value, the logic decrements the loop counter value and wraps to the start buffer pointer. When the loop counter reaches zero the logic may indicate that the test is complete. The logic may also setup an infinite loop, in which case the counter is not decremented.

Once read, the command, control (except chip select (CS) lines in 2n or 3n commands modes) and address lines will be set and override the functional path to the DDR input/output (I/O). After asserting the CS lines, a gap counter is started and counts down until it reaches zero in order to set time between different commands executed from the CADB.

Further details of the third example of interference testing will be explained with reference to FIGS. 5A-5B, which are flowcharts illustrating operations in a method to implement interference testing in an electronic device. The operations depicted in the flowchart of FIGS. 5A-5B may be implemented by the interference manager 230, alone or in combination with other components of electronic device 100.

Figure 5A:
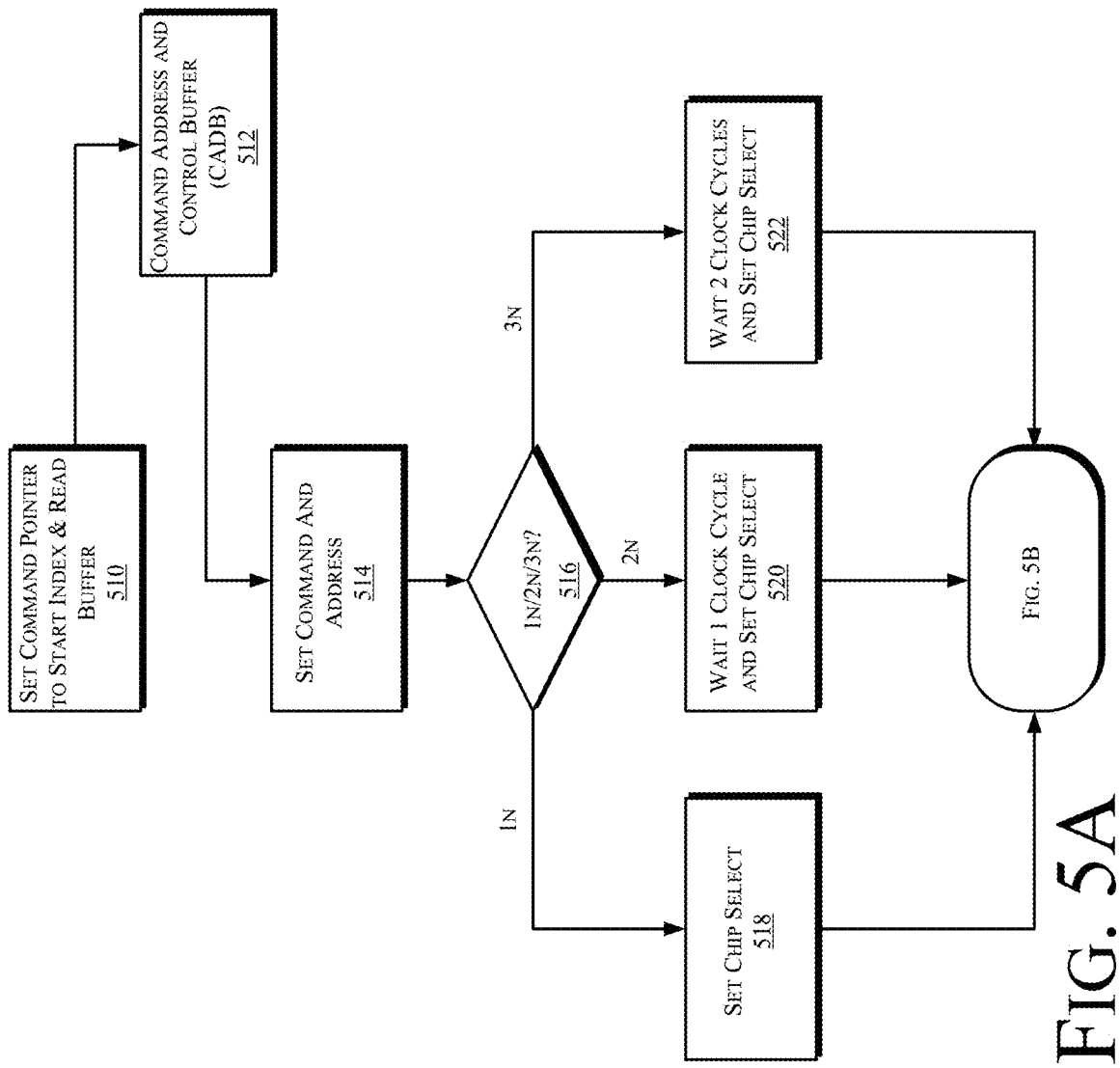
FIG. 5A is a flowchart illustrating operations in a method to implement interference testing in accordance with some examples.

Referring first to FIG. 5A, at operation 510 command pointer is set to a start index and the logic reads from the command address and control buffer CADB 512. At operation 514 the command and address are set.

At operation 516, it is determined whether the interconnect is operating in a 1n, a 2n or 3n timing mode. If the interconnect is operating in a 1n timing mode then control passes to operation 518 and the chip select (CS) line is set. By contrast, if at operation 516 the interconnect is operating in a 2n timing mode then the control passes to operation 520 and the logic allows one clock cycle to elapse before the CS line is set. If at operation 516 the interconnect is operating in a 3n timing mode then the control passes to operation 522 and the logic allows two clock cycles to elapse before the CS line is set.

Once the chip select line is set, control passes to operation 530, which monitors to determine whether the loop has finished. If, at operation 530, the loop has not finished then control passes to operation 532 and the command pointer is set to the next command in the CADB. Control then passes to operation 534, where it is determined whether the gap is greater than zero. If, at operation 534 the gap is greater than zero then control passes to operation 536 and a predetermined period of time is allowed to elapse before reading the next command from the CADB.

Referring back to operation 530, if the loop is finished then control passes to operation 540, where it is determine whether the initialization procedure is done. If the procedure is done then control passes to operation 542 and the testing process ends. By contrast, if at operation 540 the initialization procedure is not done then control passes to operation 544, and the command pointer is set to the start position of the command index. Control then passes to operation 546, where it is determined whether the wait is greater than zero. If, at operation 546 the gap is greater than zero then control passes to operation 548 and a predetermined period of time is allowed to elapse before reading the next command from the CADB.

Thus, the operations depicted in FIGS. 5A and 5B allow the logic to implement interference test schedules which incorporate a programmable number of iterations, as well as gaps and waits in the testing process. The operations depicted in FIGS. 5A-5B may be implemented in conjunction with the operations depicted in FIG. 3A and FIG. 4A, or may be implemented independently.

Figure 6:
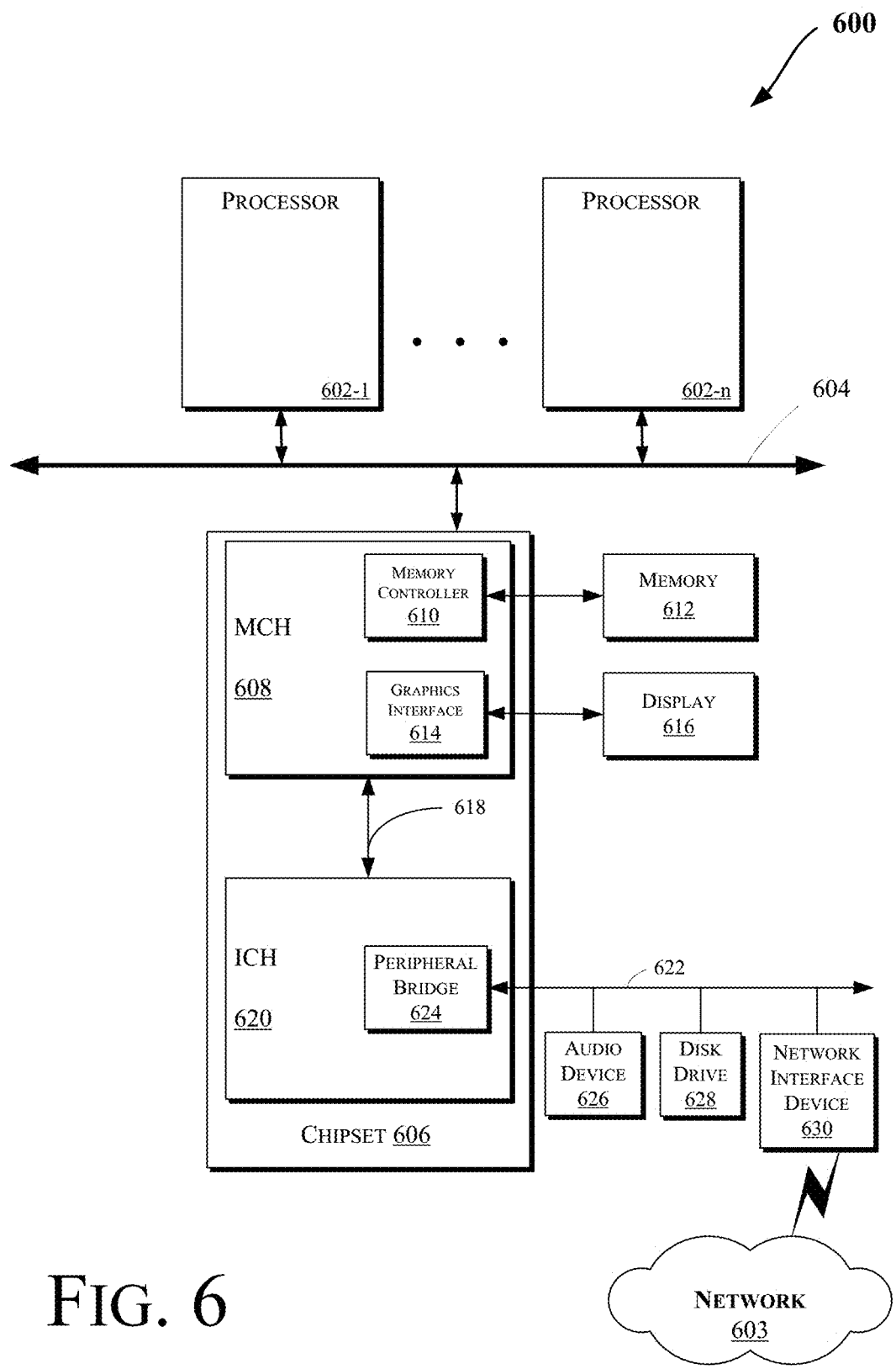
FIG. 6 is a schematic illustration of an electronic device that may be adapted to implement interference testing in accordance with some examples.

As described above, in some examples the electronic device may be embodied as a computer system. FIG. 6 illustrates a block diagram of a computing system 600 in accordance with an example. The computing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
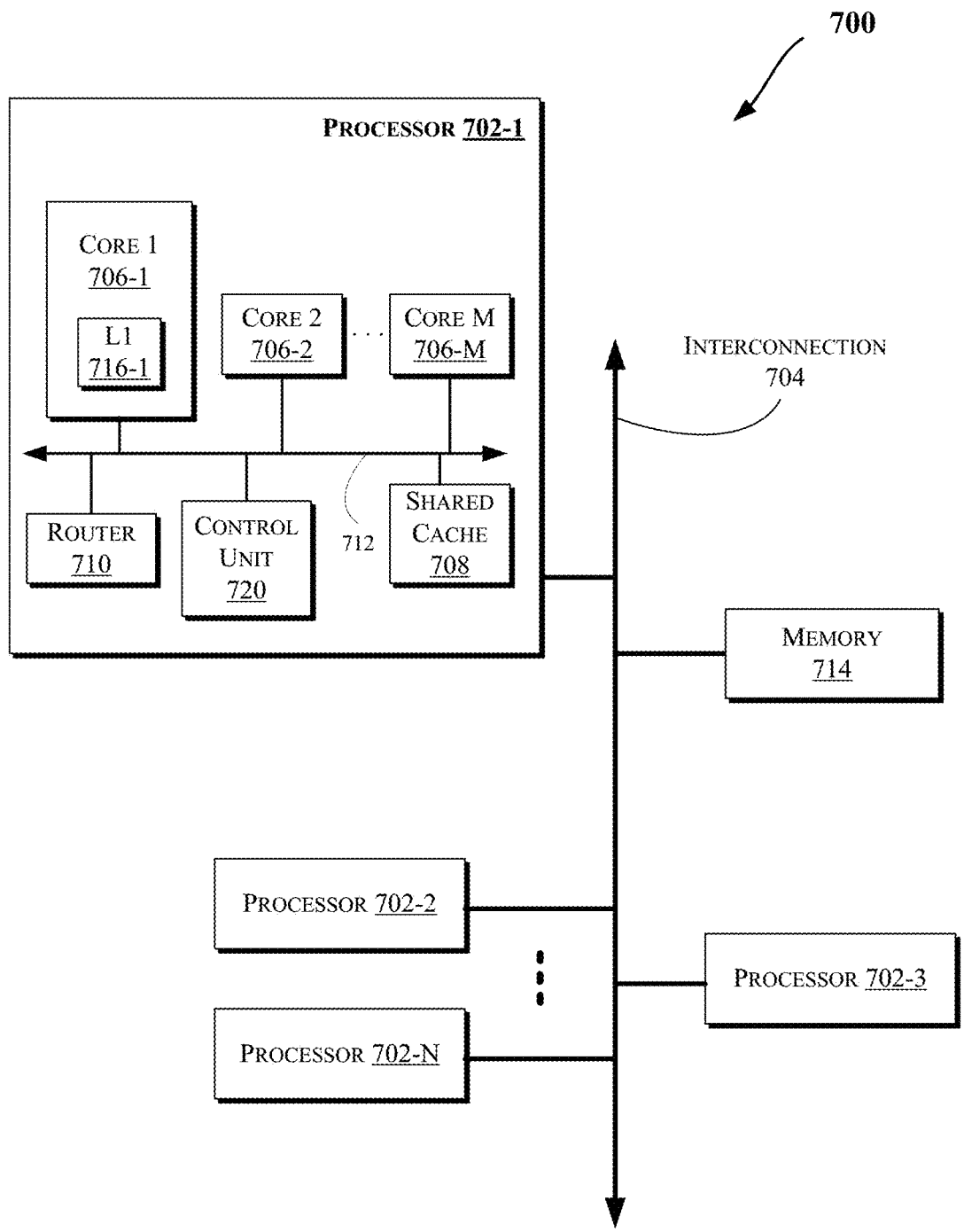
FIG. 7 is a schematic illustration of an electronic device that may be adapted to implement interference testing in accordance with some examples.

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716"). In one example, the control unit 720 may include logic to implement the operations described above with reference to the memory controller 122 in FIG. 2.

Figure 8:
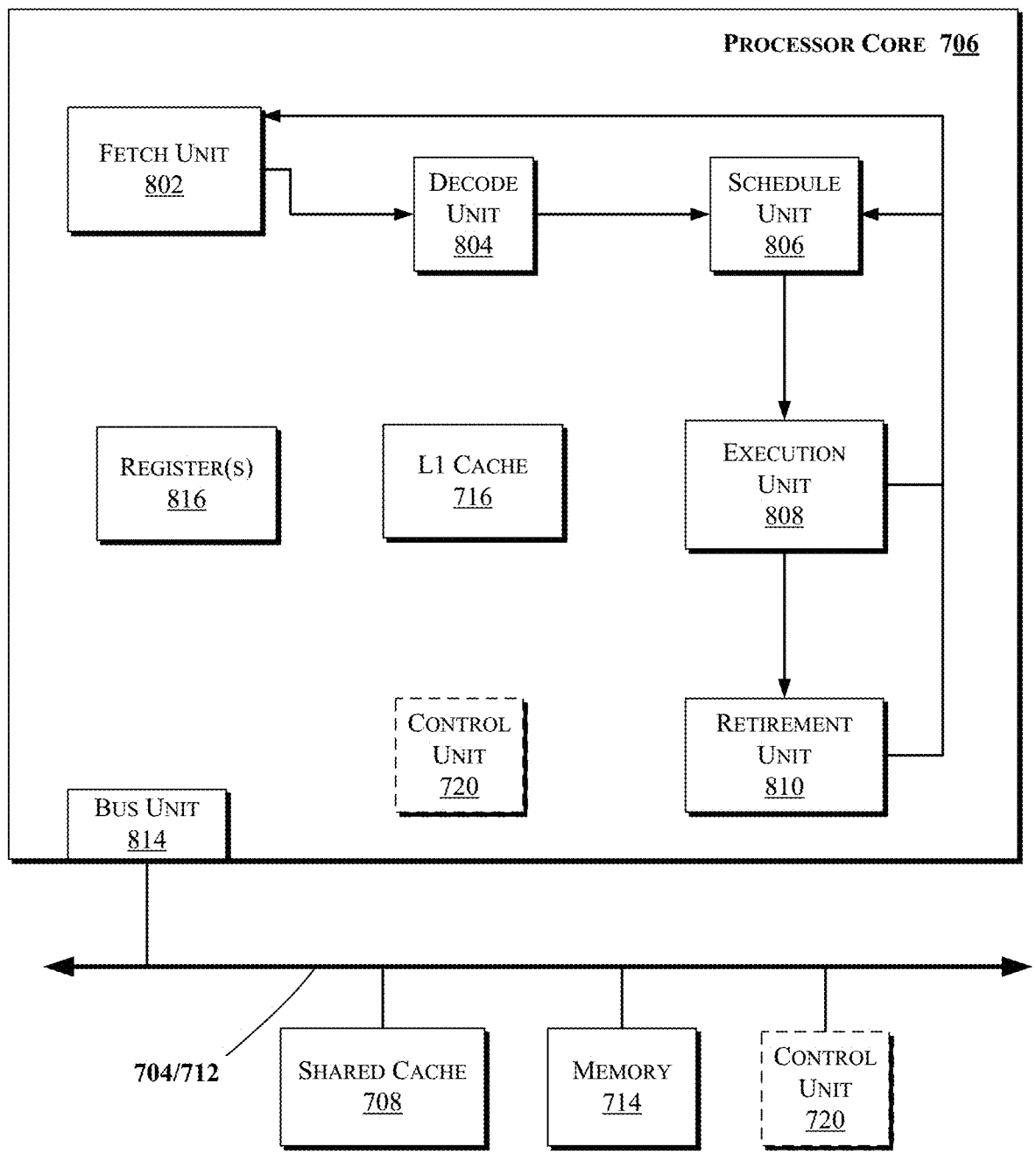
FIG. 8 is a schematic illustration of an electronic device that may be adapted to implement interference testing in accordance with some examples.

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
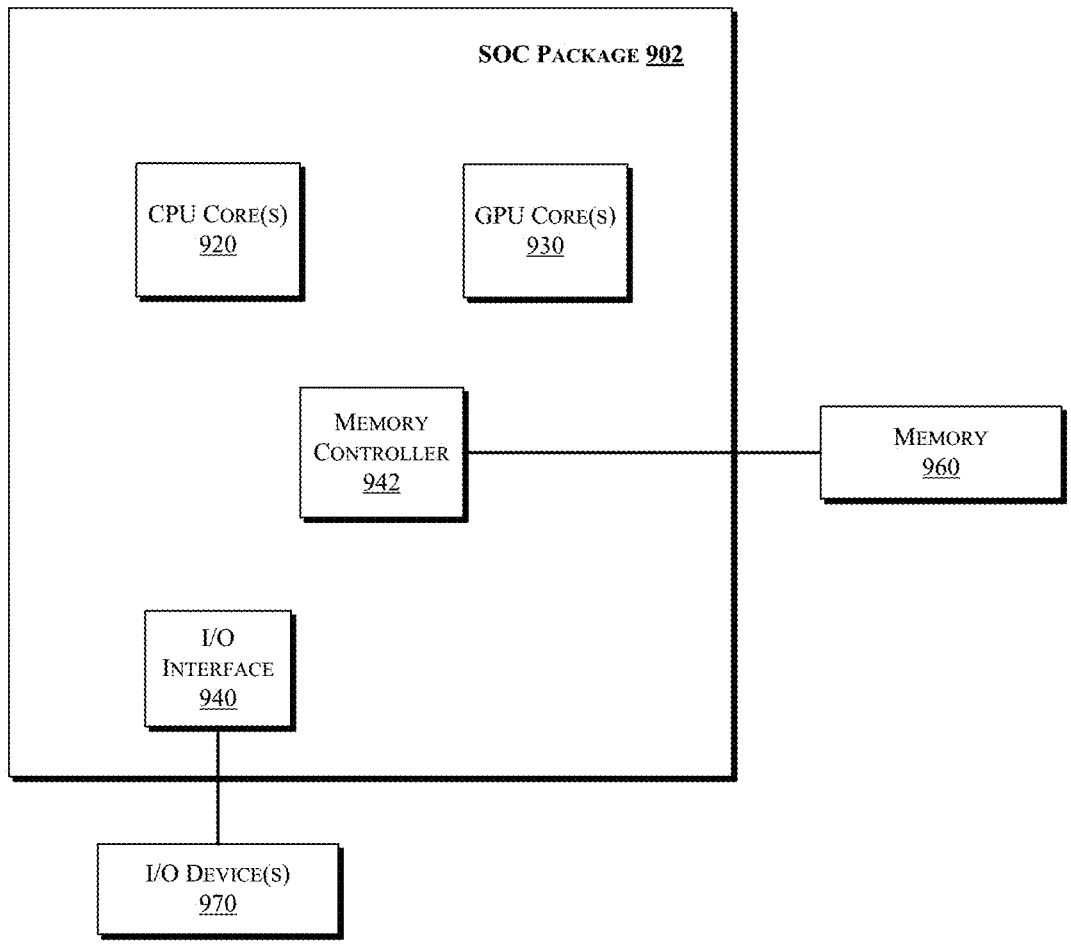
FIG. 9 is a schematic illustration of an electronic device that may be adapted to implement interference testing in accordance with some examples.

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
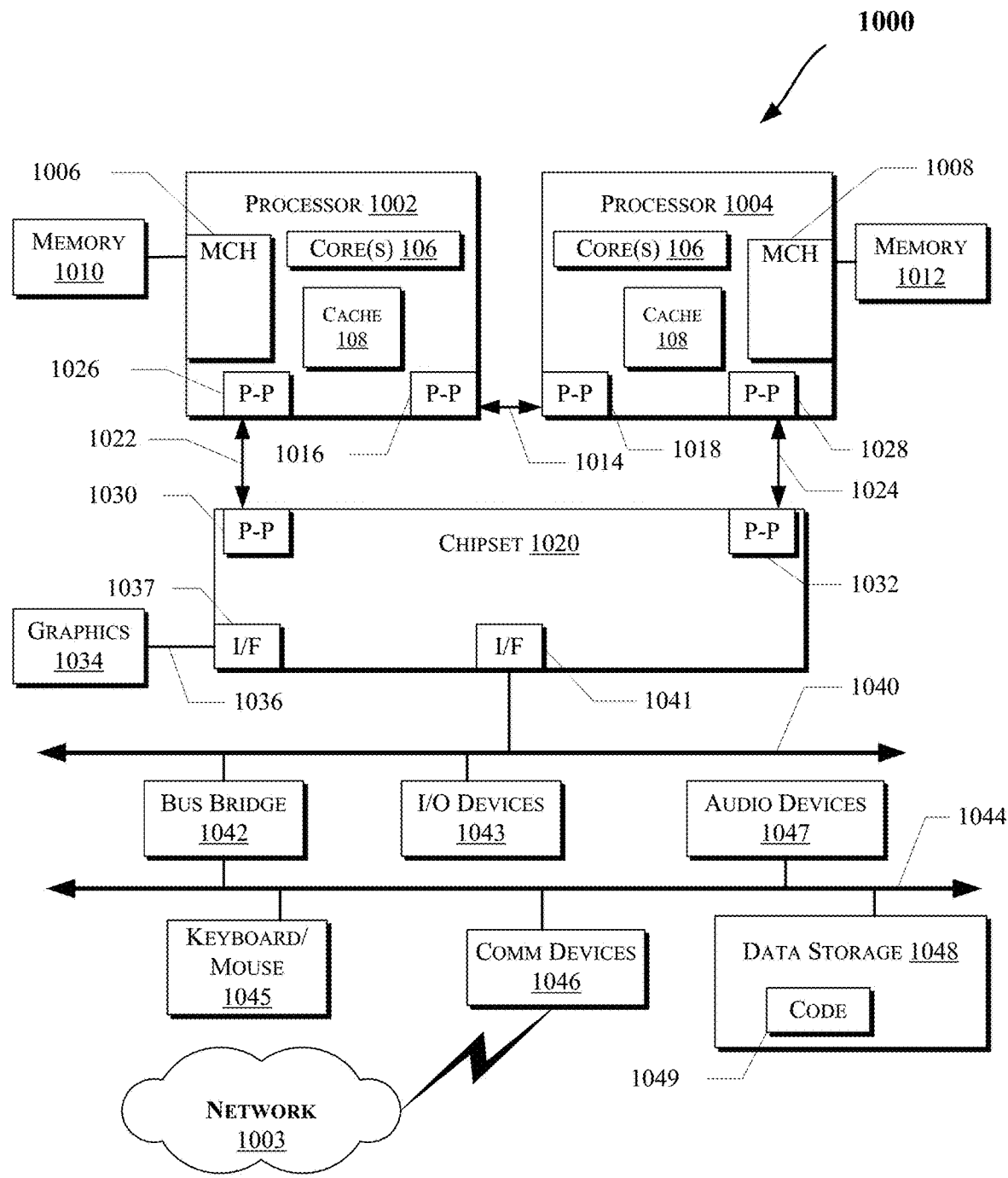
FIG. 10 is a schematic illustration of an electronic device that may be adapted to implement interference testing in accordance with some examples.

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some examples.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following examples pertain to further examples.

Example 1 is a controller, comprising logic, at least partially including hardware logic, configured to implement a first iteration of an interference test on a communication interconnect comprising a victim lane and a first aggressor lane by generating a first set of pseudo-random patterns on the victim lane and the aggressor lane using a first seed and implement a second iteration of an interference test by advancing the seed on the first aggressor lane.

In Example 2, the subject matter of Example 1 can optionally include logic further configured to advance the seed on the first aggressor lane in response to the first seed competing a cycle.

In Example 3, the subject matter of any one of Examples 1-2 can optionally include logic further configured to transmit the pseudo-random pattern on the communication interconnect.

In Example 4, the subject matter of any one of Examples 1-3 can optionally include an arrangement in which the interconnect comprises a third aggressor lane, and wherein the logic is further configured to implement a third iteration of an interference test by advancing the seed on the second aggressor lane.

In Example 5, the subject matter of any one of Examples 1-4 can optionally include logic further configured to transmit the pseudo-random pattern on the communication interconnect.

In Example 6, the subject matter of any one of Examples 1-5 can optionally include logic further configured to execute at least of a predetermined number of testing loops or a predetermined wait period.

Example 7 is an electronic device, comprising at least one processing component and a controller, comprising logic, at least partially including hardware logic, configured to implement a first iteration of an interference test on a communication interconnect comprising a victim lane and a first aggressor lane by generating a first set of pseudo-random patterns on the victim lane and the aggressor lane using a first seed and implement a second iteration of an interference test by advancing the seed on the first aggressor lane.

In Example 8, the subject matter of Example 7 can optionally include logic further configured to advance the seed on the first aggressor lane in response to the first seed competing a cycle.

In Example 9, the subject matter of any one of Examples 7-8 can optionally include logic further configured to transmit the pseudo-random pattern on the communication interconnect.

In Example 10, the subject matter of any one of Examples 7-9 can optionally include an arrangement in which the interconnect comprises a third aggressor lane, and wherein the logic is further configured to implement a third iteration of an interference test by advancing the seed on the second aggressor lane.

In Example 11, the subject matter of any one of Examples 7-10 can optionally include logic further configured to transmit the pseudo-random pattern on the communication interconnect.

In Example 12, the subject matter of any one of Examples 7-12 can optionally include logic further configured to execute at least of a predetermined number of testing loops or a predetermined wait period.

Example 13 is a computer program product comprising logic instructions stored on a non-transitory computer readable medium which, when executed by a controller, configure the controller to implement a first iteration of an interference test on a communication interconnect comprising a victim lane and a first aggressor lane by generating a first set of pseudo-random patterns on the victim lane and the aggressor lane using a first seed and implement a second iteration of an interference test by advancing the seed on the first aggressor lane.

In Example 14, the subject matter of Example 13 can optionally include logic further configured to advance the seed on the first aggressor lane in response to the first seed competing a cycle.

In Example 15, the subject matter of any one of Examples 13-14 can optionally include logic further configured to transmit the pseudo-random pattern on the communication interconnect.

In Example 16, the subject matter of any one of Examples 13-15 can optionally include an arrangement in which the interconnect comprises a third aggressor lane, and wherein the logic is further configured to implement a third iteration of an interference test by advancing the seed on the second aggressor lane.

In Example 17, the subject matter of any one of Examples 13-16 can optionally include logic further configured to transmit the pseudo-random pattern on the communication interconnect.

In Example 18, the subject matter of any one of Examples 13-17 can optionally include logic further configured to execute at least of a predetermined number of testing loops or a predetermined wait period.

Example 19 is a controller comprising logic, at least partially including hardware logic, configured to receive a reload rate parameter and a save rate parameter, generate a first set of repeating pseudo-random patterns by reloading a first seed according to the reload rate parameter and transmit the first set of repeating pseudo-random patterns on a first lane of a communication interconnect.

In Example 20, the subject matter of Example 19 can optionally include an arrangement in which the logic is further configured to save the first seed in accordance with the save rate.

In Example 21, the subject matter of any one of Examples 19-20 can optionally include logic further configured to generate a first pseudo-random pattern; and repeat a subset of the first pseudo-random pattern in accordance with the reload rate and transmit the subset of the pseudo-random pattern on the communication interconnect.

In Example 22, the subject matter of any one of Examples 19-21 can optionally include logic further configured to execute at least of a predetermined number of testing loops or a predetermined wait period.

Example 23 is an electronic device, comprising at least one processing component and a controller, comprising logic, at least partially including hardware logic, configured to receive a reload rate parameter and a save rate parameter, generate a first set of repeating pseudo-random patterns by reloading a first seed according to the reload rate parameter and transmit the first set of repeating pseudo-random patterns on a first lane of a communication interconnect.

In Example 24, the subject matter of Example 23 can optionally include an arrangement in which the logic is further configured to save the first seed in accordance with the save rate.

In Example 25, the subject matter of any one of Examples 23-24 can optionally include logic further configured to generate a first pseudo-random pattern; and repeat a subset of the first pseudo-random pattern in accordance with the reload rate and transmit the subset of the pseudo-random pattern on the communication interconnect.

In Example 26, the subject matter of any one of Examples 23-25 can optionally include logic further configured to execute at least of a predetermined number of testing loops or a predetermined wait period.

Example 27 is a computer program product comprising logic instructions stored on a non-transitory computer readable medium which, when executed by a controller, configure the controller to receive a reload rate parameter and a save rate parameter, generate a first set of repeating pseudo-random patterns by reloading a first seed according to the reload rate parameter, and transmit the first set of repeating pseudo-random patterns on a first lane of a communication interconnect.

In Example 28, the subject matter of Example 27 can optionally include an arrangement in which the logic is further configured to save the first seed in accordance with the save rate.

In Example 29, the subject matter of any one of Examples 27-28 can optionally include logic further configured to generate a first pseudo-random pattern; and repeat a subset of the first pseudo-random pattern in accordance with the reload rate and transmit the subset of the pseudo-random pattern on the communication interconnect.

In Example 30, the subject matter of any one of Examples 27-29 can optionally include logic further configured to execute at least of a predetermined number of testing loops or a predetermined wait period.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A controller, comprising logic, at least partially including hardware logic, configured to:
   receive a predetermined reload rate parameter and a save rate parameter from a memory location;
   generate a first set of repeating pseudo-random patterns by reloading a first seed according to the predetermined reload rate parameter; and
   transmit the first set of repeating pseudo-random patterns on a first lane of a communication interconnect, wherein the logic is further configured to save the first seed in accordance with the save rate.

2. The controller of claim 1, wherein the logic is configured to:
   generate a first pseudo-random pattern; and
   repeat a subset of the first pseudo-random pattern in accordance with the predetermined reload rate parameter; and
   transmit the subset of the pseudo-random pattern on the communication interconnect.

3. The controller of claim 1, wherein the logic is configured to execute at least one of:
   a predetermined number of testing loops; or
   a predetermined wait period.

4. An electronic device, comprising:
   at least one processing component; and
   a controller, comprising:
      logic, at least partially including hardware logic, configured to:
         receive a predetermined reload rate parameter and a save rate parameter from a memory location;
         generate a first set of repeating pseudo-random patterns by reloading a first seed according to the predetermined reload rate parameter; and
         transmit the first set of repeating pseudo-random patterns on a first lane of a communication interconnect, wherein the logic is further configured to save the first seed in accordance with the save rate.

5. The electronic device of claim 4, wherein the logic is configured to:
   generate a first pseudo-random pattern; and
   repeat a subset of the first pseudo-random pattern in accordance with the predetermined reload rate parameter; and
   transmit the subset of the pseudo-random pattern on the communication interconnect.

6. The controller of claim 4, wherein the logic is configured to execute at least one of:
   a predetermined number of testing loops; or
   a predetermined wait period.

7. A computer program product comprising logic instructions stored on a non-transitory computer readable medium which, when executed by a controller, configure the controller to:
- receive a predetermined reload rate parameter and a save rate parameter from a memory location;
- generate a first set of repeating pseudo-random patterns by reloading a first seed according to the predetermined reload rate parameter; and
- transmit the first set of repeating pseudo-random patterns on a first lane of a communication interconnect, wherein the logic instructions configure the controller to save the first seed in accordance with the save rate.

8. The computer program product of claim 7, wherein the logic is further configured to:
- generate a first pseudo-random pattern; and
- repeat a subset of the first pseudo-random pattern in accordance with the predetermined reload rate parameter; and
- transmit the subset of the pseudo-random pattern on the communication interconnect.

9. The computer program product of claim 7, wherein the logic is further configured to execute at least one of:
- a predetermined number of testing loops; or
- a predetermined wait period.

* * * * *